(12) United States Patent
Heuel et al.

(10) Patent No.: US 10,955,450 B2
(45) Date of Patent: Mar. 23, 2021

(54) SYSTEM AND METHOD FOR REAL-TIME VISUALIZATION OF RADIATION PATTERN

(71) Applicant: Rohde & Schwarz GmbH & Co. KG, Munich (DE)

(72) Inventors: Steffen Heuel, Munich (DE); Andre Schoch, Poing (DE); Johannes Steffens, Rosenheim (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/353,712

(22) Filed: Mar. 14, 2019

(65) Prior Publication Data
US 2020/0292605 A1   Sep. 17, 2020

(51) Int. Cl.
| | | |
|---|---|---|
| G01R 31/00 | (2006.01) | |
| G01R 29/08 | (2006.01) | |
| G01R 15/24 | (2006.01) | |
| G01R 19/00 | (2006.01) | |
| G01R 33/032 | (2006.01) | |
| H04B 10/50 | (2013.01) | |

(52) U.S. Cl.
CPC ....... *G01R 29/0885* (2013.01); *G01R 15/241* (2013.01); *G01R 15/246* (2013.01); *G01R 15/247* (2013.01); *G01R 19/0092* (2013.01); *G01R 29/0857* (2013.01); *G01R 33/0322* (2013.01); *H04B 10/502* (2013.01); *G01R 15/24* (2013.01); *G01R 15/242* (2013.01); *G01R 15/245* (2013.01)

(58) Field of Classification Search
CPC ............... G01R 15/246; G01R 15/241; G01R 19/0092; G01R 15/247; G01R 33/0322; G01R 15/24; G01R 15/242; G01R 15/245

USPC ................................ 324/72, 76.11–76.83, 96
See application file for complete search history.

(56) References Cited

U.S. PATENT DOCUMENTS

| | | | |
|---|---|---|---|
| 10,094,855 B1 | 10/2018 | Fuhr et al. | |
| 2002/0080716 A1* | 6/2002 | Asam | H03C 5/00 370/205 |
| 2004/0212401 A1* | 10/2004 | Chien | G01R 19/04 327/58 |

(Continued)

FOREIGN PATENT DOCUMENTS

| | | |
|---|---|---|
| CN | 204 389 600 U | 6/2015 |
| CN | 105242169 B | 1/2016 |
| EP | 2760176 A1 | 7/2014 |

*Primary Examiner* — Raul J Rios Russo
(74) *Attorney, Agent, or Firm* — Ditthavong & Steiner P.C.

(57) ABSTRACT

A measurement system for real-time visualization of radiation pattern is provided. The measurement system comprises an antenna array with a plurality of antennas configured to provide a voltage gain corresponding to a received radio signal. Furthermore, the measurement system comprises a plurality of radio frequency detectors configured to rectify the voltage gain from each antenna of the plurality of antennas. In addition, the measurement system comprises a plurality of amplifiers downstream of the plurality of radio frequency detectors configured to amplify the magnitude of a rectified voltage from each of the radio frequency detectors. The measurement system moreover comprises a plurality of receiving elements, each includes a light emitting diode and configured to receive an amplified voltage corresponding to each amplifier of the plurality of amplifiers.

21 Claims, 4 Drawing Sheets

(56) References Cited

U.S. PATENT DOCUMENTS

| | | | |
|---|---|---|---|
| 2005/0057298 A1* | 3/2005 | Gamble | H03G 7/001 |
| | | | 327/352 |
| 2011/0128016 A1 | 6/2011 | Yagitani et al. | |
| 2016/0286406 A1 | 9/2016 | Kamimura | |
| 2019/0011487 A1* | 1/2019 | Bassen | G01R 29/0814 |
| 2019/0204371 A1* | 7/2019 | Bassen | G01R 29/0814 |
| 2019/0372628 A1* | 12/2019 | Balteanu | H04B 7/0413 |

\* cited by examiner

SYSTEM AND METHOD FOR REAL-TIME VISUALIZATION OF RADIATION PATTERN

TECHNICAL FIELD

The invention relates to a measurement system and a corresponding measurement method for real-time visualization of radiation pattern, especially to perform measurements on radio frequency radiation to assess the signal strength and the radiation direction of the receiving signal.

BACKGROUND ART

For measuring radiation patterns, mechanically moving measuring probes are commonly used, which are moved in a lateral direction along the measurement axes and the corresponding radiation strength levels are sampled. Instead of the point by point measurement as described above, it is also possible to measure a radiation pattern by using a fixed measuring probe and by moving the device under test in a lateral direction with respect to the measurement axes.

For example, CN 105242169 B demonstrates a measuring apparatus for a signal transmitting terminal and a signal receiving terminal of a distribution frame. The apparatus comprises a housing, a testing connector and a detection module arranged in the housing. The testing connector is further connected via lead outside of the housing to obtain measurements from points to be tested.

However, utilizing measurement probes to get sampled data, disadvantageously, require a subsequent evaluation logic that involves additional processing time and consequently the system fails to perform real-time measurement.

Accordingly, there is a need to provide a measurement system and a corresponding measurement method for real-time visualization of radiation pattern as well as to perform real-time measurements in a simplified manner.

SUMMARY OF THE INVENTION

According to a first aspect of the invention, a measurement system for real-time visualization of radiation pattern is provided. The measurement system comprises an antenna array with a plurality of antennas configured to provide a voltage gain corresponding to a received radio signal. Furthermore, the measurement system comprises a plurality of radio frequency detectors configured to rectify the voltage gain from each antenna of the plurality of antennas. Advantageously, the measurement system operates on the rectified voltages corresponding to the received radio frequency signal levels and therefore leads to a simplified processing scheme. In addition, the measurement system comprises a plurality of amplifiers downstream of the plurality of radio frequency detectors configured to amplify the magnitude of a rectified voltage from each of the radio frequency detectors. The measurement system moreover comprises a plurality of receiving elements, each includes a light emitting diode and configured to receive an amplified voltage corresponding to each amplifier of the plurality of amplifiers. By way of these light emitting diodes, the measurement system is configured to optically visualize the radiation pattern in real-time, which further enables simple assessment of the measured signal strength.

In this context, it is particularly advantageous if the light emitting diode is a RGB light emitting diode, preferably a multi-color light emitting diode, configured to emit at least three different colors. Hence, a simplified and low cost measure is implemented for differentiating the radiation pattern.

According to a first preferred implementation form of said first aspect of the invention, the measurement system further comprises tuning elements configured to adjust the amplified voltage of each amplifier of the plurality of amplifiers corresponding to an input voltage range of the light emitting diode associated with it. Advantageously, the driving voltages for the light emitting diodes are adjusted separately before or during the measurement at each of the amplifier output, which significantly improves system reliability.

Moreover, the tuning element is further configured to assign different intensity levels for the amplified voltage corresponding to different colors of the light emitting diode and wherein the light emitting diode is configured to code the intensity levels of the amplified voltage with respect to different colors. Advantageously, the measured signal strengths are visually differentiable by way of the radiated colors, for instance, red denotes high signal strength, green denotes medium signal strength and so on.

According to a second preferred implementation form of said first aspect of the invention, the measurement system further comprises a reference antenna, wherein a reference color mapping is observed with respect to the intensity levels for a known radiation pattern of the reference antenna in a reference environment with a reference antenna distance. In this context, each amplifier of the plurality of amplifiers is calibrated by adjusting the intensity levels with respect to the reference color mapping. Advantageously, each amplifier is calibrated separately to provide acceptable signal intensity to drive the associated light emitting diode and thereby gives right color corresponding to the known antenna pattern, which significantly improves measurement accuracy.

According to a further preferred implementation form of said first aspect of the invention, the observation of the reference color mapping is performed with a camera. In this context, the antennas, radio frequency detectors, amplifiers and receiving elements are arranged in pixels and wherein the camera is further configured to film the pixels and visually displays the measured radiation pattern in real-time. Advantageously, a simplified observation scheme is implemented where a camera films the pixels with different radiated colors corresponding to different radiation strength.

According to a second aspect of the invention, a measurement method for real-time visualization of radiation pattern in a measurement system comprising an antenna array with a plurality of antennas, a plurality of radio frequency detectors, a plurality of amplifiers and a plurality of receiving elements including light emitting diodes is provided. The measurement method comprises the steps of obtaining a voltage gain from each antenna of the plurality of antennas corresponding to a received radio signal, rectifying the voltage gain, amplifying the magnitude of a rectified voltage from each of the radio frequency detectors, and receiving an amplified voltage from each amplifier of the plurality of amplifiers downstream of the plurality of radio frequency detectors. Advantageously, the method provides a simplified processing scheme that operates on the rectified voltages corresponding to the received radio frequency signal levels and thereby enables simple assessment of the measured signal strength by way of the light emitting diodes by optically visualizing the radiation pattern in real-time.

In this context, it is particularly advantageous if the light emitting diode is a RGB light emitting diode, preferably a multi-color light emitting diode, configured to emit at least three different colors. Hence, a simplified and low cost measure is implemented for differentiating the radiation pattern.

According to a first preferred implementation form of said second aspect of the invention, the measurement method further comprises the step of adjusting the amplified voltage of each amplifier of the plurality of amplifiers corresponding to an input voltage range of the light emitting diode associated with it. Advantageously, the driving voltages for the light emitting diodes are adjusted separately before or during the measurement at each of the amplifier output, which significantly improves system reliability.

Moreover, the measurement method further comprises the steps of assigning different intensity levels for the amplified voltage corresponding to different colors of the light emitting diode and coding the intensity levels of the amplified voltage with respect to different colors of the light emitting diode. Advantageously, the measured signal strengths are visually differentiable by way of the radiated colors, for instance, red denotes high signal strength, green denotes medium signal strength and so on.

According to a second preferred implementation form of said second aspect of the invention, the measurement system further comprises a reference antenna and wherein the measurement method further comprises the steps of observing a reference color mapping with respect to the intensity levels for a known radiation pattern of the reference antenna in a reference environment with a reference antenna distance and calibrating each amplifier of the plurality of amplifiers by adjusting the intensity levels with respect to the reference color mapping. Advantageously, each amplifier is calibrated separately to provide acceptable signal intensity to drive the associated light emitting diode and thereby gives right color corresponding to the known antenna pattern, which significantly improves measurement accuracy.

According to a further preferred implementation form of said second aspect of the invention, the observation of the reference color mapping is performed with a camera and the measurement method further comprises the steps of arranging the antennas, radio frequency detectors, amplifiers and receiving elements in pixels and filming the pixels and visually displaying the measured radiation pattern in real-time. Advantageously, a simplified observation scheme is implemented where a camera films the pixels with different radiated colors corresponding to different radiation strength.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Reference will now be made in detail to the embodiments of the present invention, examples of which are illustrated in the accompanying drawings. Similar entities and reference numbers in different figures have been partially omitted. However, the following embodiments of the present invention may be variously modified and the range of the present invention is not limited by the following embodiments.

Figure 1:
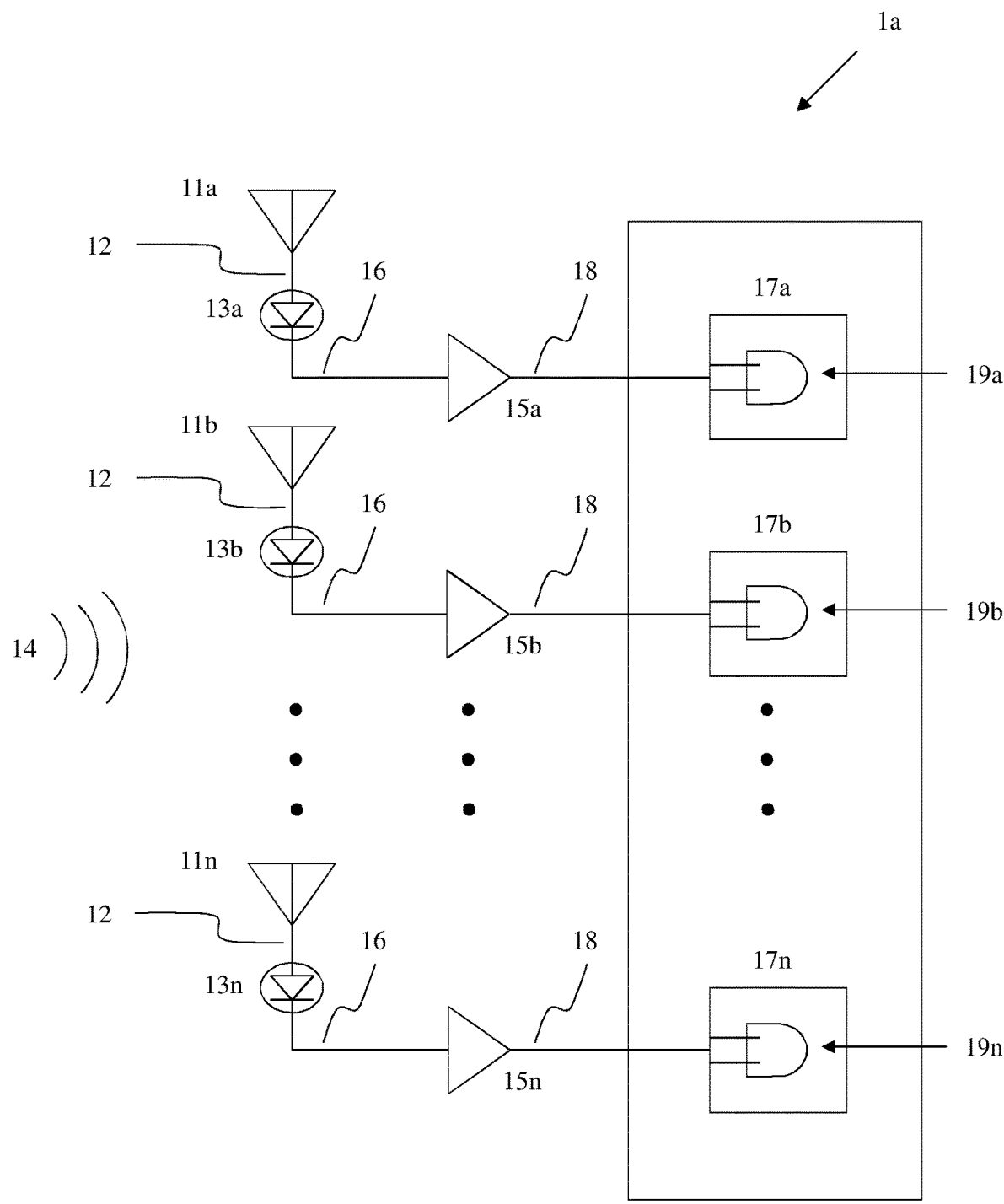
FIG. 1 shows an exemplary embodiment of the first aspect of the invention.

In FIG. 1, an exemplary embodiment of the inventive measurement system 1a for real-time visualization of radiation pattern is illustrated. In this context, the measurement system 1a comprises an antenna array with a plurality of antennas 11a, 11b, . . . , 11n configured to provide a voltage gain 12 corresponding to a received radio signal 14. Furthermore, the measurement system 1a comprises a plurality of radio frequency detectors 13a, 13b, . . . , 13n configured to rectify the voltage gain 12 from each antenna of the plurality of antennas 11a, 11b, . . . , 11n. The antenna array can be, by way of example, a form of phased array configured to perform constructive and/or destructive interference when receiving the radio signal and each antenna of the plurality of antennas 11a, 11b, . . . , 11n provides a corresponding voltage gain to the subsequently connected plurality of radio frequency detectors 13a, 13b, . . . , 13n for rectification. The said subsequent connection can be implemented by means of transmission lines, for instance via coaxial cables. Alternatively, it is also possible to construct each antenna 11a, 11b, . . . , 11n along with a corresponding radio frequency detector 113a, 13b, . . . , 13n as a single element on the antenna array.

In addition, the measurement system 1a comprises a plurality of amplifiers 15a, 15b, . . . , 15n downstream of the plurality of radio frequency detectors 13a, 13b, . . . 13n configured to amplify the magnitude of a rectified voltage from each of the radio frequency detectors 13a, 13b, . . . , 13n. The measurement system 1a moreover comprises a plurality of receiving elements 17a, 17b, . . . , 17n, each includes a light emitting diode 19a, 19b, . . . , 19n and configured to receive an amplified voltage 18 corresponding to each amplifier of the plurality of amplifiers 15a, 15b, . . . , 15n. The light emitting diodes are generally RGB light emitting diodes, preferably multi-color light emitting diodes that can emit at least three different colors. Alternatively, at least three separate light emitting diodes with different color can be incorporated instead of a single multi-color light emitting diode. By way of these light emitting diodes 19a, 19b, . . . , 19n, the measurement system 1a provides a simple and cost-effective scheme to optically visualize the radiation pattern in real-time.

Figure 2:
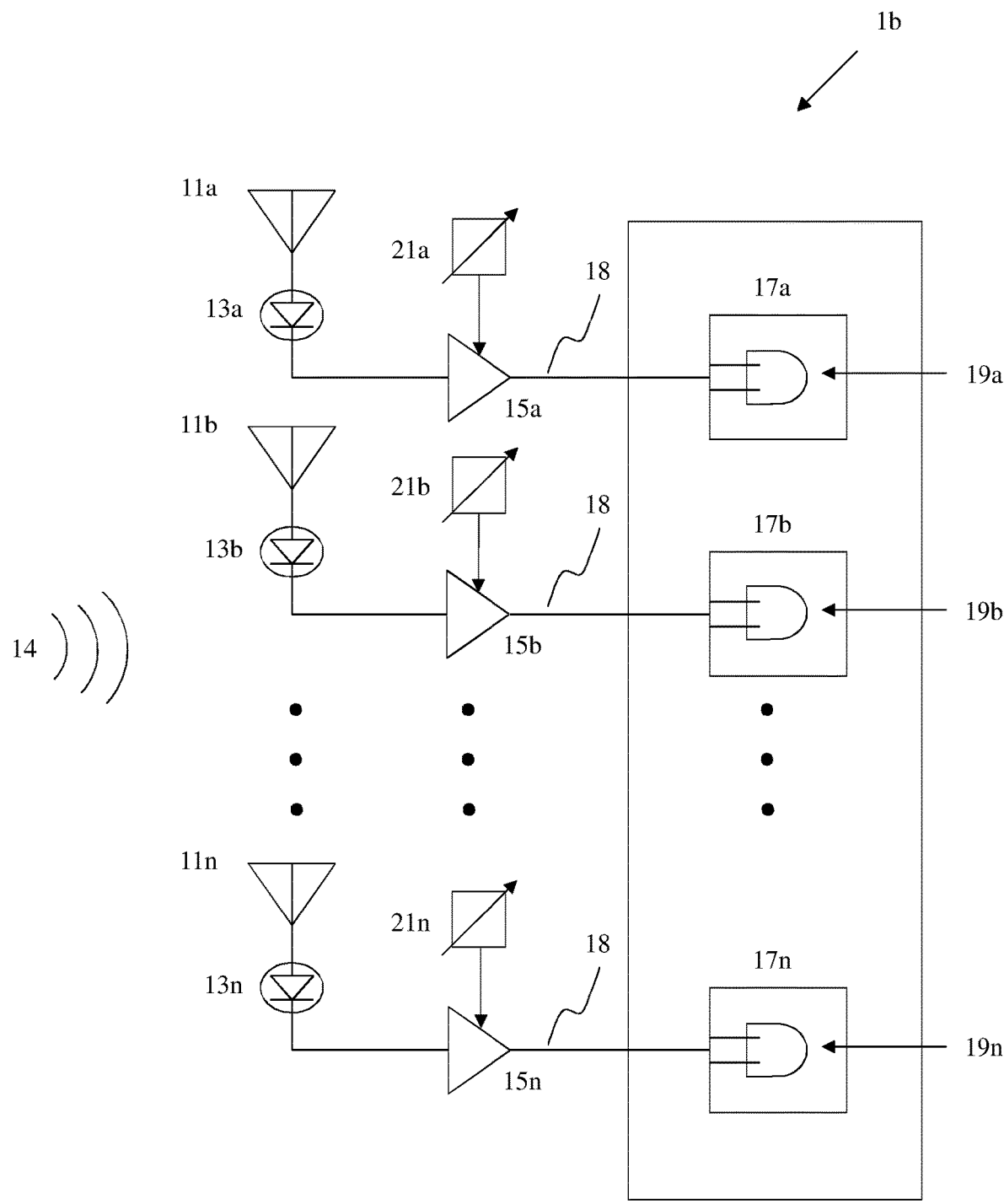
FIG. 2 shows a second exemplary embodiment of the first aspect of the invention.

In FIG. 2, a second exemplary embodiment of the inventive measurement system 1b for real-time visualization of radiation pattern is illustrated. The respective measurement system 1b is based on the above-mentioned first exemplary embodiment 1a and additionally comprises tuning elements 21a, 21b, . . . , 21n configured to adjust the amplified voltage 18 of each amplifier of the plurality of amplifiers 15a, 15b, . . . , 15n corresponding to an input voltage range of the light emitting diode 19a, 19b, . . . , 19n associated with it. In this context, the tuning element 21a, 21b, . . . , 21n is further configured to assign different intensity levels for the amplified voltage 18 corresponding to different colors of the light emitting diode 19a, 19b, . . . , 19n and the light emitting diode 19a, 19b, . . . , 19n is configured to code the intensity levels of the amplified voltage 18 with respect to different colors. By way of example, the tuning elements 21a, 21b, . . . , 21n may comprise adjustable positive linear voltage regulators that vary the rectified and successively amplified voltages with respect to an internal reference voltage. The internal reference voltage can be selected, for instance, according to the minimum drive voltage for the light emitting diodes 19a, 19b, . . . , 19n.

Since, it is possible to receive different radiation intensity at different antennas 11a, 11b, . . . 11n of the antenna array regarding the propagation direction of the received signal, assigning tuning elements 21a, 21b, . . . , 21n to each of the plurality of amplifiers 15a, 15b, . . . , 15n significantly improves system reliability. Furthermore, the regulated voltage levels are then categorized in at least three reference voltage levels with respect to drive voltage levels required by the light emitting diodes 19a, 19b, . . . , 19n to radiate corresponding colors. For example, RED color can be associated with the high voltage levels and can be translated as high radiation intensity, BLUE color can be associated with the low voltage levels and can be translated as low radiation intensity and so on. Advantageously, due to the simplicity of above-described color translations the system does not require trained personal to conduct measurements.

Figure 3:
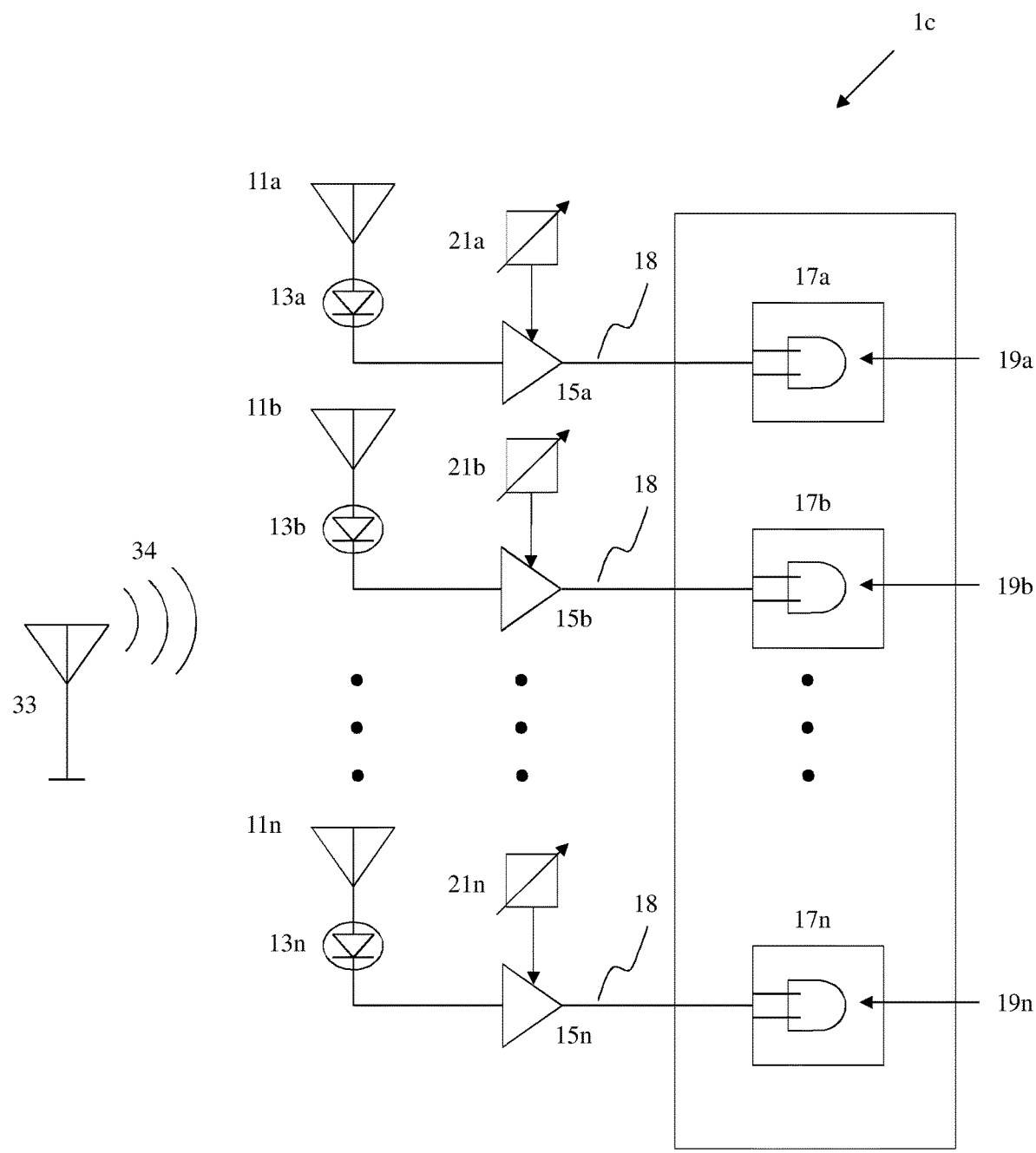
FIG. 3 shows a third exemplary embodiment of the first aspect of the invention.

In FIG. 3, a third exemplary embodiment of the inventive measurement system 1b for real-time visualization of radiation pattern is illustrated. The respective measurement system 1c is based on the second exemplary embodiment 1b and further comprises a reference antenna 33, wherein a reference color mapping is observed with respect to the intensity levels for a known radiation pattern of the reference antenna 33 in a reference environment with a reference antenna distance. In this context, each amplifier of the plurality of amplifiers 15a, 15b, . . . , 15n is calibrated by adjusting the intensity levels with respect to the reference color mapping. Each amplifier 15a, 15b, . . . , 15n is calibrated separately through the tuning elements 21a, 21b, . . . , 21n to provide acceptable signal intensity to drive the associated light emitting diode 19a, 19b, . . . , 19n and thereby gives the right color corresponding to the known antenna pattern, for instance RED for high radiation intensity, BLUE for low radiation intensity and so on.

Preferably, the observation of the reference color mapping is performed with a camera. In this context, the antennas 11a, 11b, . . . , 11n, radio frequency detectors 13a, 13b, . . . , 13n, amplifiers 15a, 15b, . . . , 15n and receiving elements 17a, 17b, . . . , 17n are arranged in pixels and the camera is further configured to film the pixels and visually displays the measured radiation pattern in real-time. Alternatively, it is also possible to observe and compare the radiation intensity levels by implementing analog-to-digital converters, wherein the corresponding voltage levels are preferably displayed in real-time via graphical representation and/or tabular form. Advantageously, by means of analog-to-digital converters, the measurement data corresponding to the reference color mapping can be stored in a memory location and can be utilized before and/or during the measurement for calibrating the amplifiers 15a, 15b, . . . , 15n.

Figure 4:
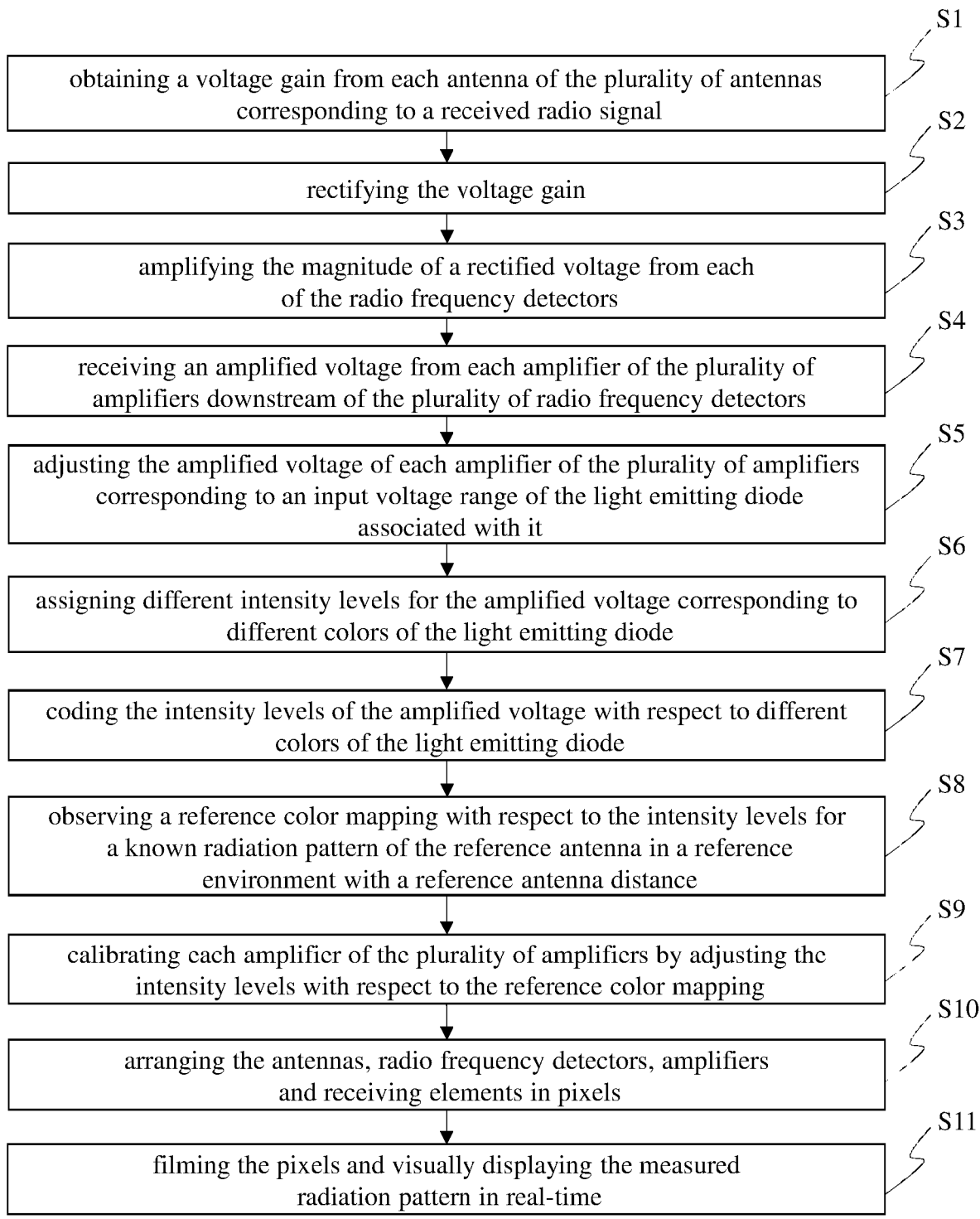
FIG. 4 shows a flow chart of an exemplary embodiment of the second aspect of the invention.

In FIG. 4, a flow chart of an exemplary embodiment of the inventive measurement method for real-time visualization of radiation pattern is illustrated. In a first step S1, a voltage gain from each antenna of the plurality of antennas corresponding to a received radio signal is obtained. In a second step S2, the corresponding received voltage gain is rectified. In a third step S3, the magnitude of a rectified voltage from each of the radio frequency detectors is amplified. In a fourth step S4, an amplified voltage from each amplifier of the plurality of amplifiers downstream of the plurality of radio frequency detectors is received.

Then, in a fifth step S5, the amplified voltage of each amplifier of the plurality of amplifiers is adjusted corresponding to an input voltage range of the light emitting diode associated with it. In a sixth step S6, different intensity levels for the amplified voltage are assigned corresponding to different colors of the light emitting diode. In a seventh step S7, the intensity levels of the amplified voltage are coded with respect to different colors of the light emitting diode.

Furthermore, in an eighth step S8, a reference color mapping is observed with respect to the intensity levels for a known radiation pattern of the reference antenna in a reference environment with a reference antenna distance. In a ninth step S9, each amplifier of the plurality of amplifiers is calibrated by adjusting the intensity levels with respect to the reference color mapping.

Moreover, in a tenth step S10, the antennas, radio frequency detectors, amplifiers and receiving elements are arranged in pixels. Finally, in an eleventh step S11, the pixels are filmed and the measured radiation pattern is displayed visually in real-time.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement system for real-time visualization of radiation pattern comprising:
   an antenna array with a plurality of antennas configured to provide a voltage gain corresponding to a received radio signal,
   a plurality of radio frequency detectors configured to rectify the voltage gain from each antenna of the plurality of antennas,
   a plurality of amplifiers downstream of the plurality of radio frequency detectors configured to amplify the magnitude of a rectified voltage from each of the radio frequency detectors, and
   a plurality of receiving elements, each including a light emitting diode and being configured to receive an amplified voltage corresponding to each amplifier of the plurality of amplifiers.

2. The measurement system according to claim 1, wherein the light emitting diode is a RGB light emitting diode, preferably a multi-color light emitting diode, configured to emit at least three different colors.

3. The measurement system according to claim 1, further comprising tuning elements configured to adjust the amplified voltage of each amplifier of the plurality of amplifiers corresponding to an input voltage range of the light emitting diode associated with each amplifier.

4. The measurement system according to claim 3, wherein each tuning element is further configured to assign different intensity levels for the amplified voltage corresponding to different colors of the light emitting diode.

5. The measurement system according to claim 4, wherein the light emitting diode is configured to code the intensity levels of the amplified voltage with respect to different colors.

6. The measurement system according to claim 1, further comprising a reference antenna, wherein a reference color mapping is observed with respect to intensity levels for a known radiation pattern of the reference antenna in a reference environment with a reference antenna distance.

7. The measurement system according to claim 6, wherein each amplifier of the plurality of amplifiers is calibrated by adjusting the intensity levels with respect to the reference color mapping.

8. The measurement system according to claim 6, wherein the observation of the reference color mapping is performed with a camera.

9. The measurement system according to claim 1, wherein the antennas, radio frequency detectors, amplifiers and receiving elements are arranged in pixels.

10. The measurement system according to claim 8, wherein the camera is further configured to film the pixels and visually displays the measured radiation pattern in real-time.

11. The measurement system according to claim 6, wherein the observation of the reference color mapping is implemented with analog-to-digital converters, and wherein corresponding voltage levels are displayed on a remote light emitting diode display.

12. A measurement method for real-time visualization of radiation pattern in a measurement system comprising an antenna array with a plurality of antennas, a plurality of radio frequency detectors, a plurality of amplifiers and a plurality of receiving elements including light emitting diodes, comprising the steps of:
obtaining a voltage gain from each antenna of the plurality of antennas corresponding to a received radio signal,
rectifying the voltage gain,
amplifying the magnitude of a rectified voltage from each of the radio frequency detectors, and
receiving an amplified voltage from each amplifier of the plurality of amplifiers downstream of the plurality of radio frequency detectors.

13. The measurement method according to claim 12, wherein each light emitting diode is a RGB light emitting diode, preferably a multi-color light emitting diode, configured to emit at least three different colors.

14. The measurement method according to claim 12, further comprising the step of adjusting the amplified voltage of each amplifier of the plurality of amplifiers corresponding to an input voltage range of the light emitting diode associated with each amplifier.

15. The measurement method according to claim 12, further comprising the step of assigning different intensity levels for the amplified voltage corresponding to different colors of the light emitting diode.

16. The measurement method according to claim 12, further comprising the step of coding intensity levels of the amplified voltage with respect to different colors of the light emitting diode.

17. The measurement method according to claim 12, further comprising a reference antenna and the step of observing a reference color mapping with respect to intensity levels for a known radiation pattern of a reference antenna in a reference environment with a reference antenna distance.

18. The measurement method according to claim 17, further comprising the step of calibrating each amplifier of the plurality of amplifiers by adjusting the intensity levels with respect to the reference color mapping.

19. The measurement method according to claim 17, wherein the observation of the reference color mapping is performed with a camera.

20. The measurement method according to claim 12, further comprising the step of arranging the antennas, radio frequency detectors, amplifiers and receiving elements in pixels.

21. The measurement method according to claim 20, further comprising the step of filming the pixels and visually displaying the measured radiation pattern in real-time.

* * * * *